(12) United States Patent
Bedell et al.

(10) Patent No.: US 10,079,341 B1
(45) Date of Patent: Sep. 18, 2018

(54) THREE-TERMINAL NON-VOLATILE MULTI-STATE MEMORY FOR COGNITIVE COMPUTING APPLICATIONS

(71) Applicant: INTERNATIONAL BUSINESS MACHINES CORPORATION, Armonk, NY (US)

(72) Inventors: Stephen W. Bedell, Wappingers Falls, NY (US); Kevin W. Brew, White Plains, NY (US); Joel P. de Souza, Putnam Valley, NY (US); Seyoung Kim, White Plains, NY (US); Ning Li, White Plains, NY (US); Yun Seog Lee, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/457,433

(22) Filed: Mar. 13, 2017

(51) Int. Cl.
*H01L 45/00* (2006.01)
*G11C 13/00* (2006.01)
*H01L 27/24* (2006.01)

(52) U.S. Cl.
CPC ............ *H01L 45/08* (2013.01); *G11C 13/004* (2013.01); *G11C 13/0007* (2013.01); *G11C 13/0069* (2013.01); *H01L 27/2463* (2013.01); *H01L 45/147* (2013.01); *H01L 45/1608* (2013.01)

(58) Field of Classification Search
CPC ... H01L 45/08; H01L 45/085; H01L 45/1206; H01L 45/147
See application file for complete search history.

(56) References Cited

U.S. PATENT DOCUMENTS

| | | | | |
|---|---|---|---|---|
| 7,462,857 | B2 * | 12/2008 | Arai | H01L 29/8615 257/2 |
| 8,242,478 | B2 * | 8/2012 | Sakamoto | H01L 27/24 257/2 |
| 2012/0280224 | A1 * | 11/2012 | Doolittle | C01G 33/00 257/43 |
| 2015/0340609 | A1 * | 11/2015 | Banno | H01L 45/085 257/4 |

* cited by examiner

*Primary Examiner* — Allison P Bernstein
(74) *Attorney, Agent, or Firm* — Tutunjian & Bitetto, P.C.; Louis J. Percello

(57) ABSTRACT

A three-terminal non-volatile multi-state device based on mobile ion induced electrical resistivity change is provided. The three-terminal non-volatile multi-state memory device includes a substrate having a first electrode and a second electrode therein. The three-terminal non-volatile multi-state memory device further includes a mobile ion including resistor layer disposed over the first electrode, the second electrode, and part of the substrate. The three-terminal non-volatile multi-state memory device also includes a third electrode formed over the mobile ion including resistor layer. The three-terminal non-volatile multi-state memory device provides multi-level states determined by an electrical resistivity the mobile ion including resistor layer which changes the electrical resistivity based on the mobile ion concentration in the material.

18 Claims, 21 Drawing Sheets

THREE-TERMINAL NON-VOLATILE MULTI-STATE MEMORY FOR COGNITIVE COMPUTING APPLICATIONS

BACKGROUND

Technical Field

The present invention relates generally to computer memory and, in particular, to an array of three-terminal non-volatile, multi-level memory devices for cognitive computing applications.

Description of the Related Art

Various types of conventional memories exist and have been used for neuromorphic systems. However, there is a need for a non-volatile memory for cognitive and related computing applications.

SUMMARY

According to an aspect of the present invention, a three-terminal non-volatile multi-level memory device based on mobile ion induced electrical resistivity change is provided. The three-terminal non-volatile multi-level memory device includes a substrate having a first electrode and a second electrode therein. The three-terminal non-volatile multi-level memory device further includes a mobile ion including resistor layer disposed over the first electrode, the second electrode, and part of the substrate. The three-terminal non-volatile multi-level memory device also includes a third electrode formed over the mobile ion including resistor layer.

According to another aspect of the present invention, a non-volatile multi-level memory array based on mobile ion induced electrical resistivity change is provided. The non-volatile multi-level memory array includes a plurality of three-terminal non-volatile memory devices. Each of the plurality of three-terminal non-volatile multi-level memory devices includes a substrate having a first electrode and a second electrode therein. Each of the plurality of three-terminal non-volatile multi-level memory devices further includes a mobile ion including resistor layer disposed over the first electrode, the second electrode, and part of the substrate. Each of the plurality of three-terminal non-volatile multi-level memory devices also includes a third electrode formed over the mobile ion including resistor layer.

According to yet another aspect of the present invention, method is provided for forming a three-terminal non-volatile multi-level memory device based on mobile ion induced electrical resistivity change. The method includes forming a substrate having a first electrode and a second electrode therein. The method further includes forming a mobile ion including resistor layer disposed over the first electrode, the second electrode, and part of the substrate. The method also includes forming a third electrode over the mobile ion including resistor layer.

These and other features and advantages, will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a three-terminal non-volatile memory array, for cognitive computing applications. The memory array works on a principle of mobile ion concentration induced electrical resistance change.

In an embodiment, the present invention provides a memristive device having the following characteristics: analog modulation between resistance states; bi-directionality pending input signal (e.g., increase/decrease resistance for positive/negative pulses); non-volatile (holds the states indefinitely); symmetrically modulated (e.g. when provided with n positive signals, n negative signals must return the device state to the original resistance, noting that conventional devices (RRAM CBRAM, and so forth) are not symmetrically modulated.

Figure 1:
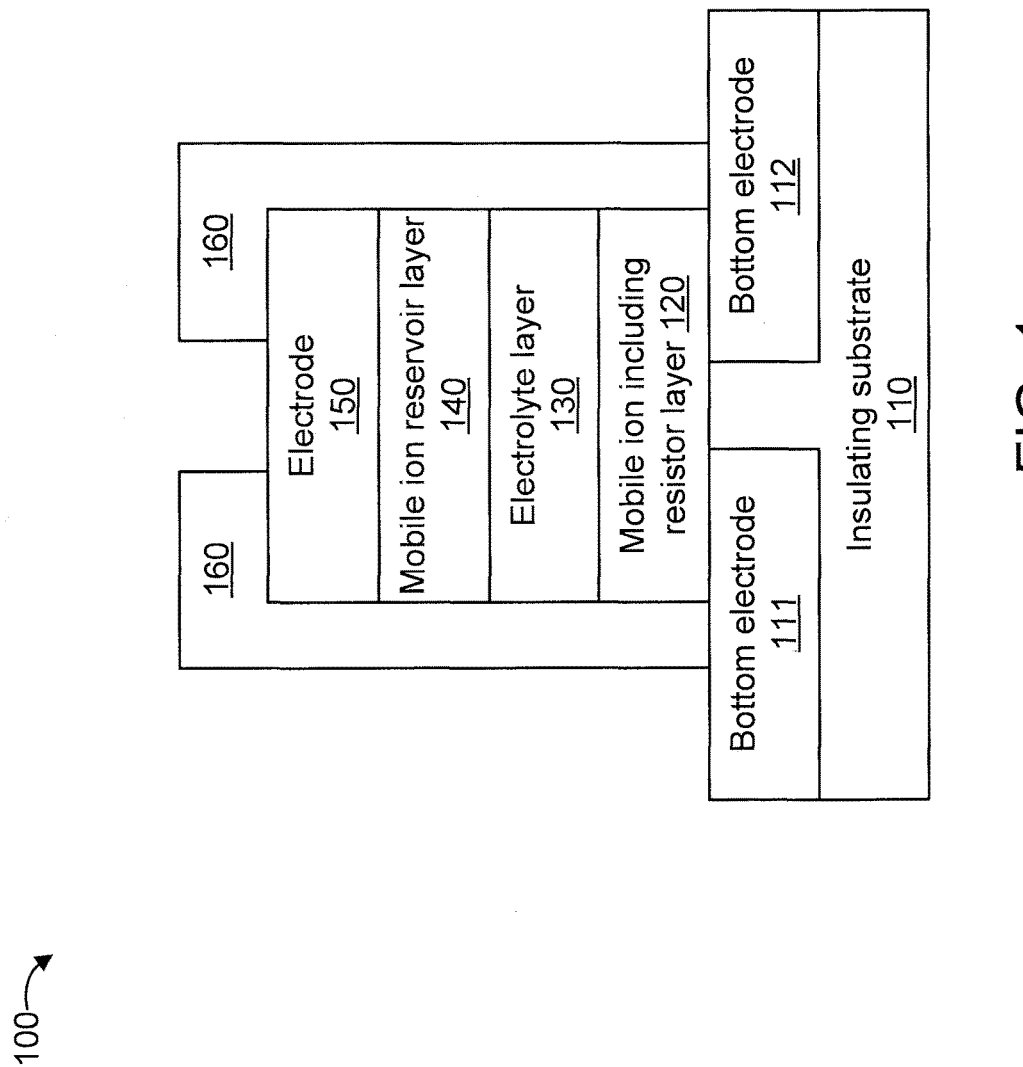
FIG. 1 shows an exemplary three-terminal non-volatile multi-state memory, in accordance with an embodiment of the present invention.

FIG. 1 shows an exemplary three-terminal non-volatile multi-state memory 100, in accordance with an embodiment of the present invention.

The three-terminal non-volatile memory (hereinafter "memory" in short) 100 includes an insulating substrate layer 110, an electrode (also interchangeable referred to as "bottom electrode") 111, an electrode (also interchangeable referred to as "bottom electrode") 112, a mobile ion including resistor layer 120, an electrolyte layer 130, a mobile ion reservoir layer 140, an electrode (also interchangeable referred to as "top electrode") 150, and a passivation layer 160. It is to be appreciated that FIG. 1 does not show scale relative to the different elements of FIG. 1.

In an embodiment, the insulating substrate 110 can be formed from any insulating material and preferably materials resistant to mobile ion diffusion.

In an embodiment, the bottom electrodes 111 and 112 can be formed from any conducting material, In an embodiment, the bottom electrodes 111 and 112 can be formed from, for example, but not limited to, Ti, Ta, Ni Al, Au, Pt, and so forth. In an embodiment, the bottom electrodes 111 and 112 are each formed in the insulating substrate layer 110.

In an embodiment, the mobile ion including resistor layer 120 can be formed from any mobile-ion bearing material that changes its electrical resistivity by the mobile ion concentration. In an embodiment, the mobile ion including resistor layer 120 can be a mobile ion bearing material formed from, for example, but not limited to, Lithium (Li), $LiCoO_2$, $LiNbO_3$, $LiMnO_2$, and so forth. In an embodiment, the mobile ion including resistor layer 120 is doped to reduce a volume change during an ion migration process such as a lithiation process and a de-lithiation process. In an embodiment, the mobile ion including resistor layer 120 is formed from Mn doped $LiCoO_2$. In an embodiment, the mobile ion including resistor layer comprises a plurality of crystals that are thermally treated to improve a crystal structure and a crystal orientation of the plurality of crystals.

In an embodiment, the electrolyte 130 can be formed from any electrolyte material. The electrolyte material preferably has a high conductivity for mobile ions and low conductivity for electrons. In an embodiment, the electrolyte 130 can be formed from, for example, but not limited to, lithium phosphorus oxynitride (LiPON).

In an embodiment, the mobile ion reservoir layer 140 can be formed from any mobile ion bearing material. In an embodiment, the mobile ion (lithium) reservoir layer 140 can be formed from, for example, but not limited to, Lithium (Li), $LiCoO_2$, $LiNbO_3$, $LiMnO_2$, and so forth.

In an embodiment, the electrode 150 can be formed from any conducting material. In an embodiment, the electrode 150 can be formed from, for example, but not limited to, Ni, Cu, Au, Pt, and so forth.

Figure 2:
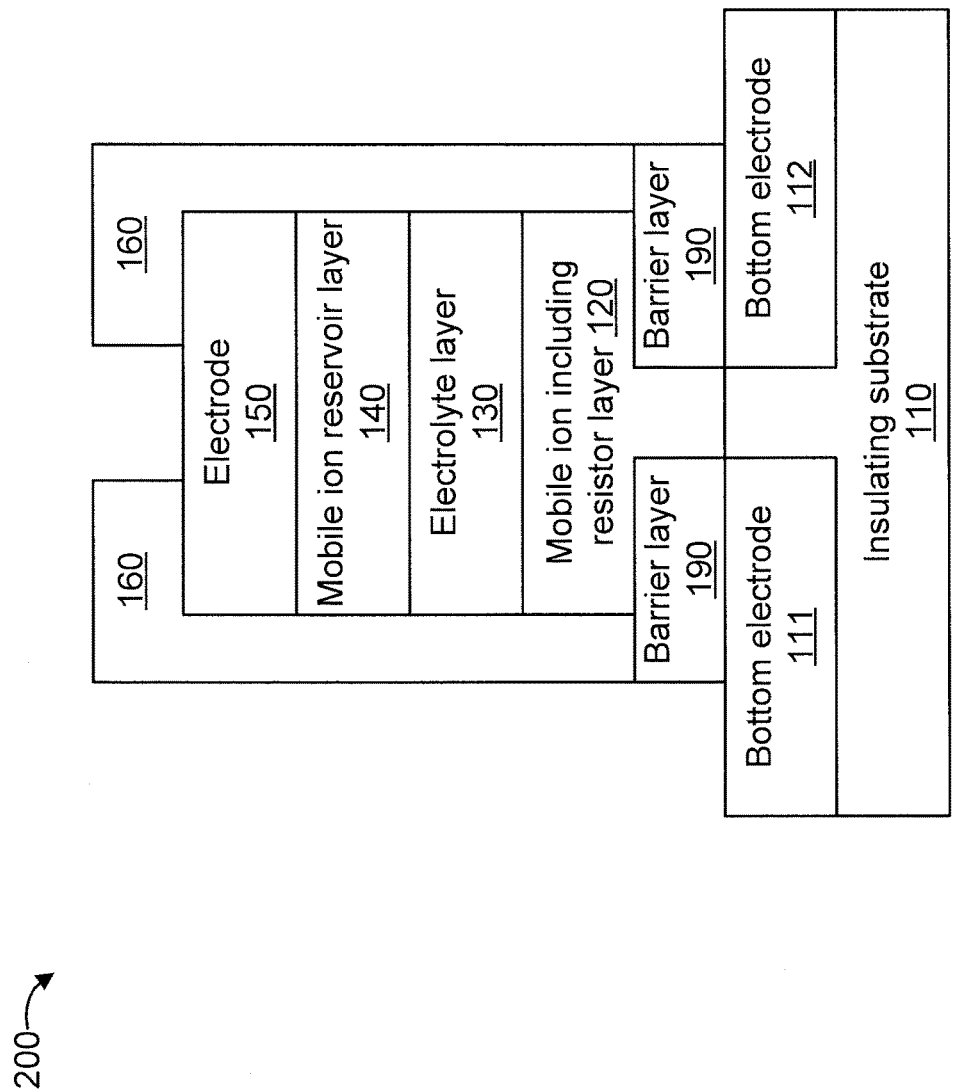
FIG. 2 shows another exemplary three-terminal non-volatile multi-state memory, in accordance with an embodiment of the present invention.

FIG. 2 shows another exemplary three-terminal non-volatile multi-state memory 200, in accordance with an embodiment of the present invention.

The three-terminal non-volatile memory 200 of FIG. 2 is similar to the three-terminal non-volatile memory 100 of FIG. 1, with the addition of an electrically conductive mobile ion barrier layer 190 disposed between the mobile ion including resistor layer 120 and the bottom electrodes 111 and 112. The electrically conductive mobile ion barrier layer 190 prevents mobile ions from diffusing out to the bottom electrodes 111 and 112 and the passivation layer 160. It is to be appreciated that FIG. 1 does not show scale relative to the different elements of FIG. 1.

Figure 3:
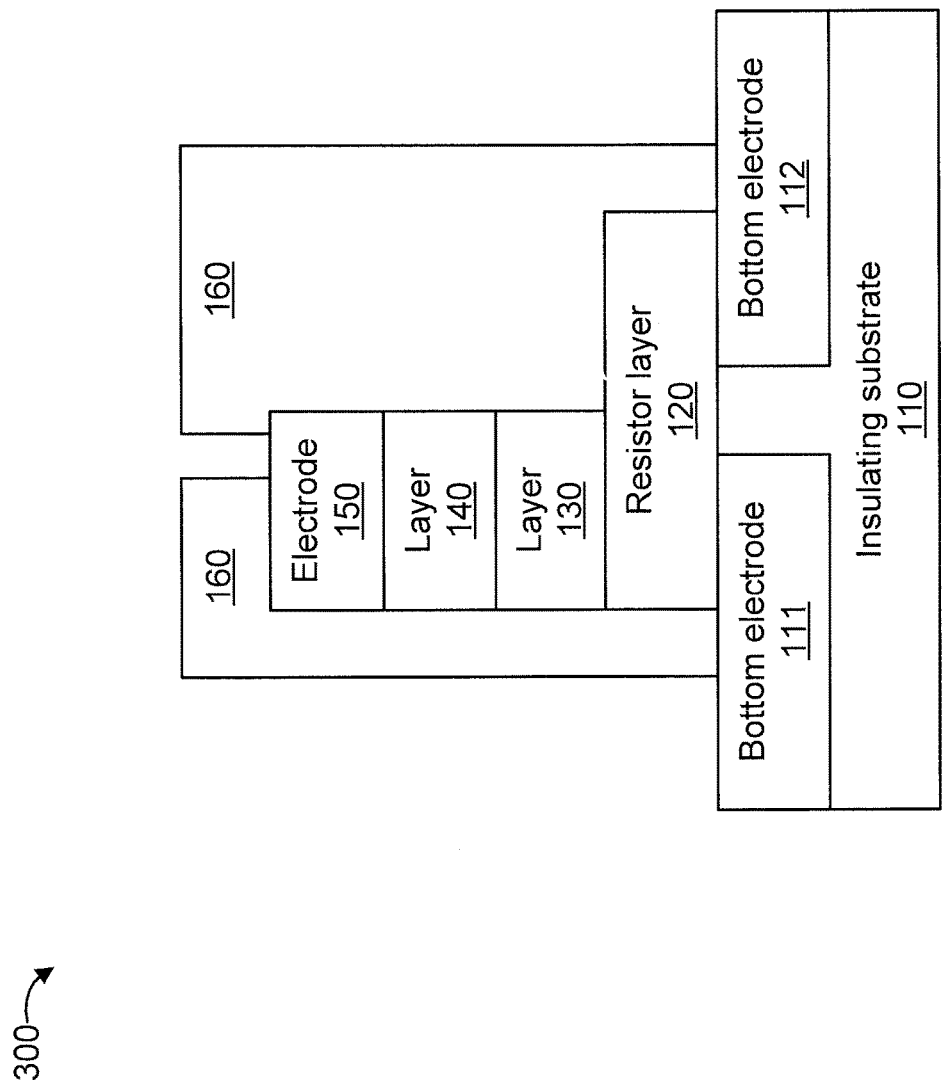
FIG. 3 shows yet another exemplary three-terminal non-volatile multi-state memory, in accordance with an embodiment of the present invention.

FIG. 3 shows yet another exemplary three-terminal non-volatile multi-state memory 300, in accordance with an embodiment of the present invention.

The three-terminal non-volatile memory 300 of FIG. 3 is similar to the three-terminal non-volatile memory 100 of FIG. 1, with changes to the dimensions of some of the layers as shown in FIG. 3. In particular, the respective widths of the following layers have changed: the electrolyte layer 130, the mobile ion including reservoir layer 140, the electrode 150, and the passivation layer 160.

In embodiment, the present invention can provide a Li-composition induced resistance change. For example, the present invention can provide a $Li_xCoO_2$ layer for $>100_x$ electrical resistivity change by controlling Li concentration. In an embodiment, possible alternatives include, but are not limited to, $LiNbO_3$, $LiMnO_2$, and so forth.

In an embodiment, a set process by Li-ion migration (ionic conduction) can be performed between the mobile ion including resistor layer 120 and the mobile ion reservoir layer 140.

In an embodiment, a read process by electronic conduction can be between the bottom electrodes 111 and 112.

In an embodiment, the electronic conductivity of the electrolyte layer 130 can be low corresponding to a long retention time.

Figure 4:
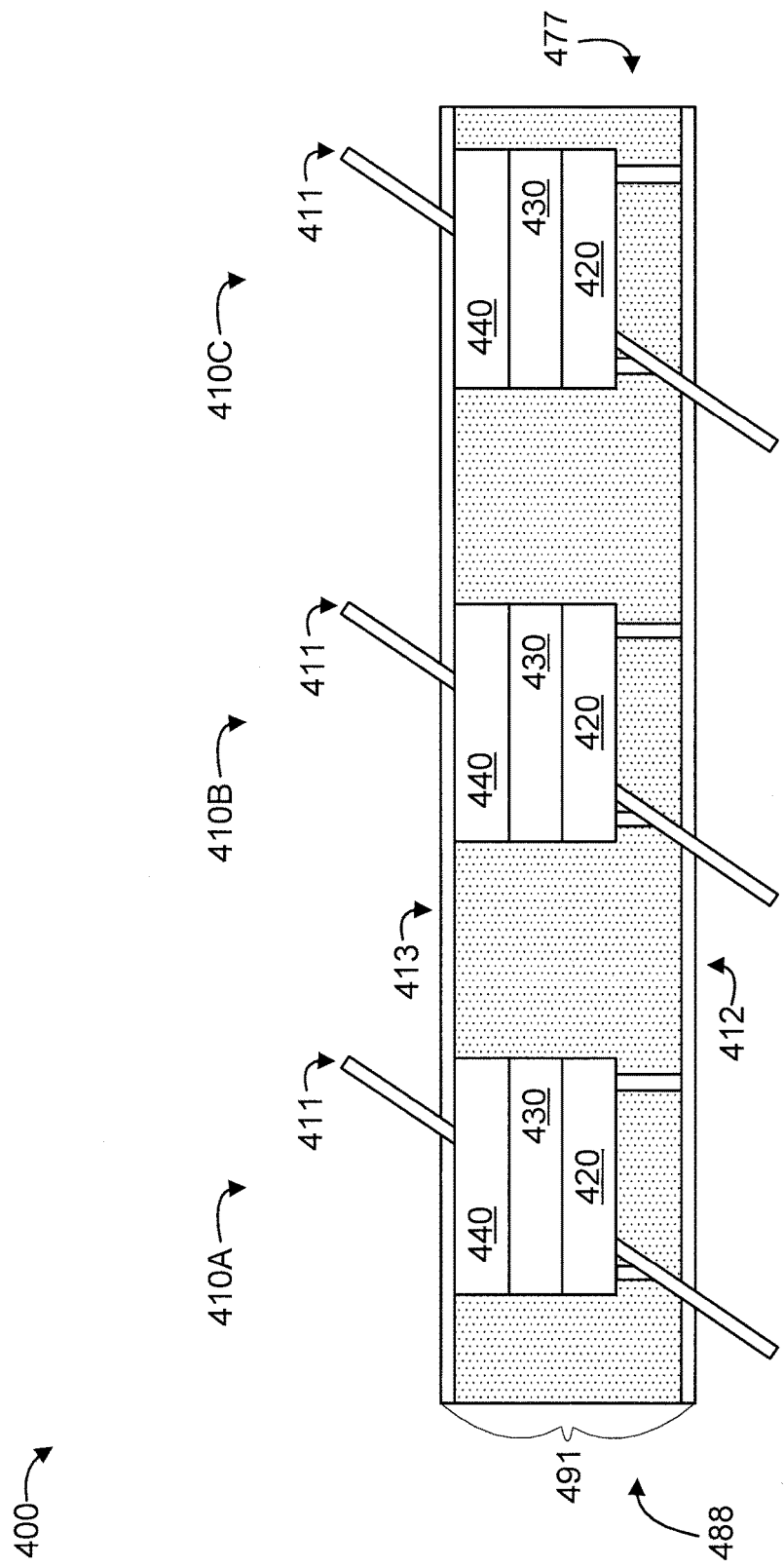
FIG. 4 shows an angled side view of an exemplary resistive memory array, in accordance with an embodiment of the present invention.
Figure 5:
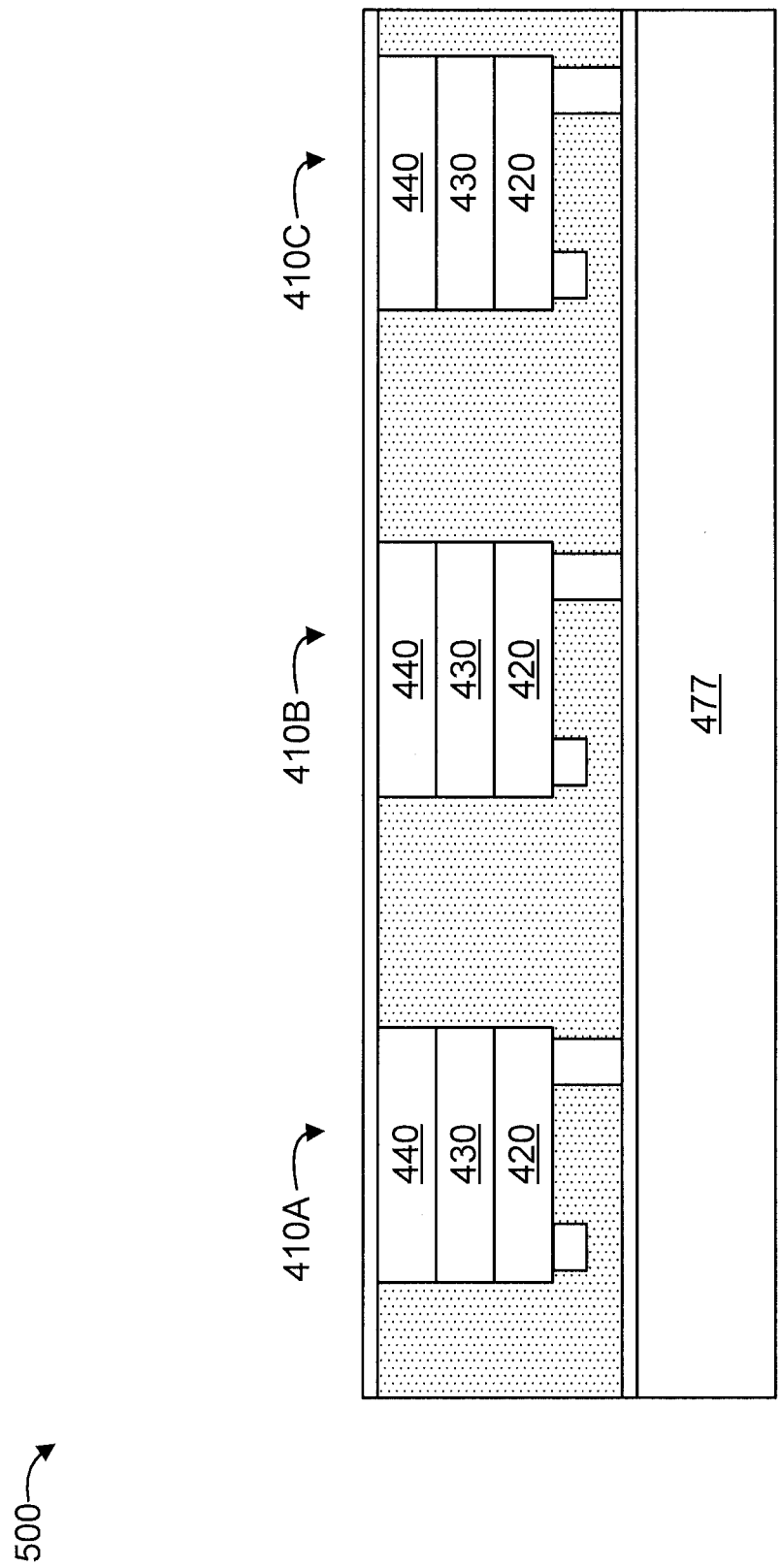
FIG. 5 shows a side view of the exemplary resistive memory array of FIG. 4, in accordance with an embodiment of the present invention.

FIG. 4 shows an angled side view of an exemplary resistive memory array 400, in accordance with an embodiment of the present invention. FIG. 5 shows a side view of the exemplary resistive memory array 400 of FIG. 4, in accordance with an embodiment of the present invention. It is to be noted that FIG. 21 can also be considered to show a top view of the exemplary resistive memory array 400 of FIG. 4, in accordance with an embodiment of the present invention.

The resistive memory array 400 includes a set of three-terminal resistive memory devices 410 (i.e., devices 410A-410F, with only, devices 410A-410C able to be seen in FIGS. 4 and 5 due to their respective perspectives). Each of the three-terminal resistive memory devices 410A-410F can correspond to the three-terminal non-volatile memory 100 of FIG. 1 or the three-terminal non-volatile memory 200 of FIG. 2 or the three-terminal non-volatile memory 300 of FIG. 3.

The devices 410A-410F are arranged on a layer 491. Each of the devices 410A-410F includes a bottom electrode 411, a bottom electrode 412, and a top electrode 413. The bottom electrode 411, the bottom electrode 412, and the top electrode 413 can correspond to the bottom electrode 111, the bottom electrode 112, and the electrode 150 of the three-terminal non-volatile memory 100 of FIG. 1, respectively (as well as the three-terminal non-volatile memory 200 of FIG. 2 or the three-terminal non-volatile memory 300 of FIG. 3). Each of the devices 410A-410F further includes a mobile ion including resistor layer 420, an electrolyte layer 430, and a mobile ion (lithium) reservoir layer 440. The mobile ion including resistor layer 420, the electrolyte layer 430, and the mobile ion (lithium) reservoir layer 440 can correspond to the mobile ion including resistor layer 120, the electrolyte layer 130, and the mobile ion (lithium) reservoir layer 140 of the three-terminal non-volatile memory 100 of FIG. 1, respectively (as well as the three-terminal non-volatile memory 200 of FIG. 2 or the three-terminal non-volatile memory 300 of FIG. 3). The devices 410A-410F can be formed on a substrate 477 (see element 110 in FIG. 1). The substrate 477 can correspond to the insulating substrate 110 of the three-terminal non-volatile memory 100 of FIG. 1 (as well as the three-terminal non-volatile memory 200 of FIG. 2 or the three-terminal non-volatile memory 300 of FIG. 3). Regarding each of the devices 410A-410F, the remaining elements of the three-terminal non-volatile memory 100 (as well as the three-terminal non-volatile memory 200 of FIG. 2 and the three-terminal non-volatile memory 300 of FIG. 3) are not shown for the sakes of brevity and clarity.

The bottom electrodes 411 and 412 can be considered to be formed on a bottom electrode layer 488.

In order to select a cell and write to the cell, a positive or negative current or voltage pulse with pre-determined amplitude and time is applied between the top electrode 413 and the bottom electrode 411. Mobile ions, with the same amount to the applied charge current, are migrated between the mobile ion reservoir layer and the mobile ion including resistor layer. The total amount of mobile ion migration through the electrolyte layer is determined based on the required resistance change in the mobile ion including resistor layer.

In order to select a cell and read from the cell, a voltage is applied between the bottom electrode 412 and the bottom electrode 411 and a current is measured, indicating the state of memory device.

Figure 6:
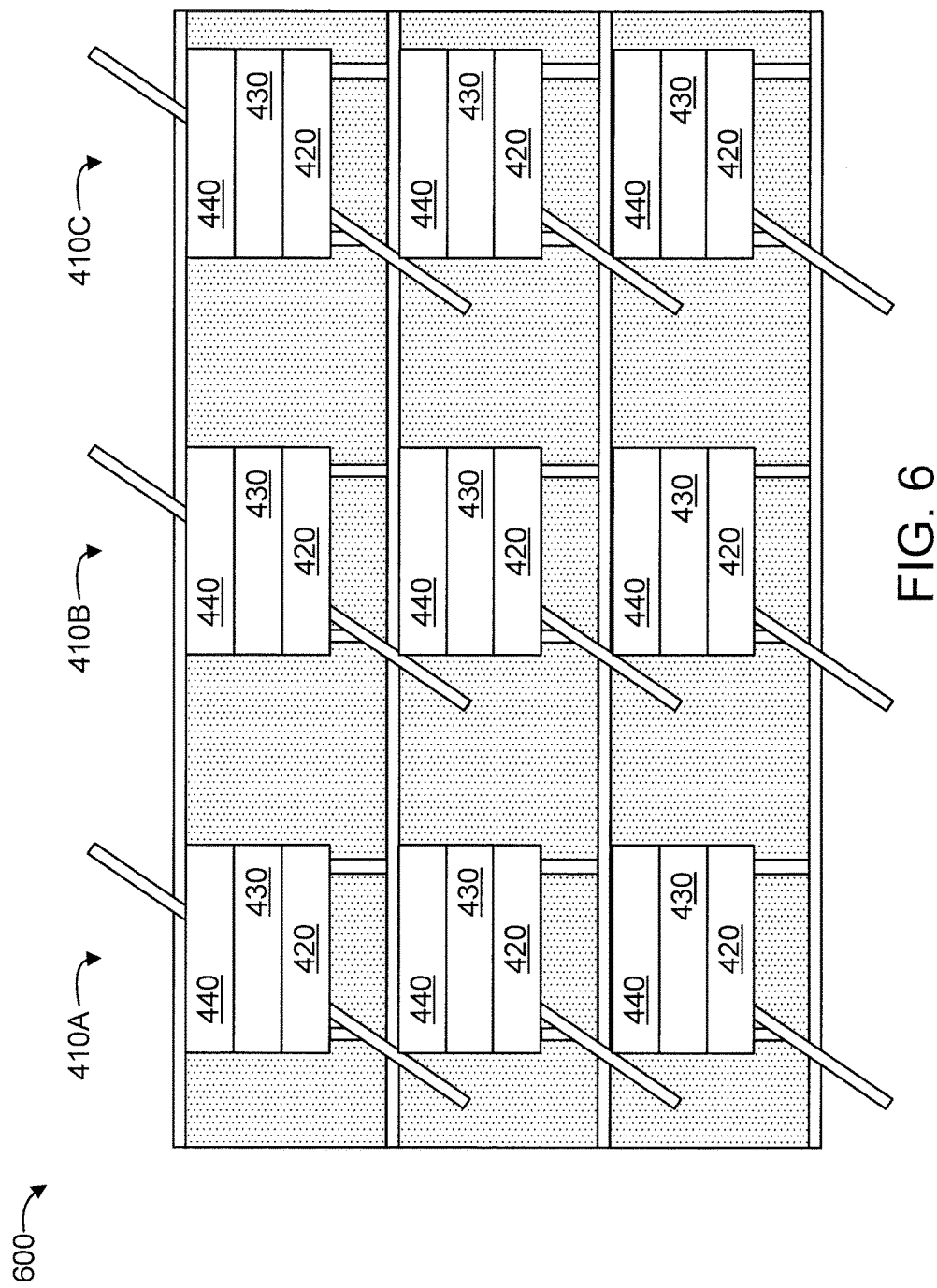
FIG. 6 shows a top view of the exemplary resistive memory array of FIG. 4, in accordance with an embodiment of the present invention.
Figure 7:
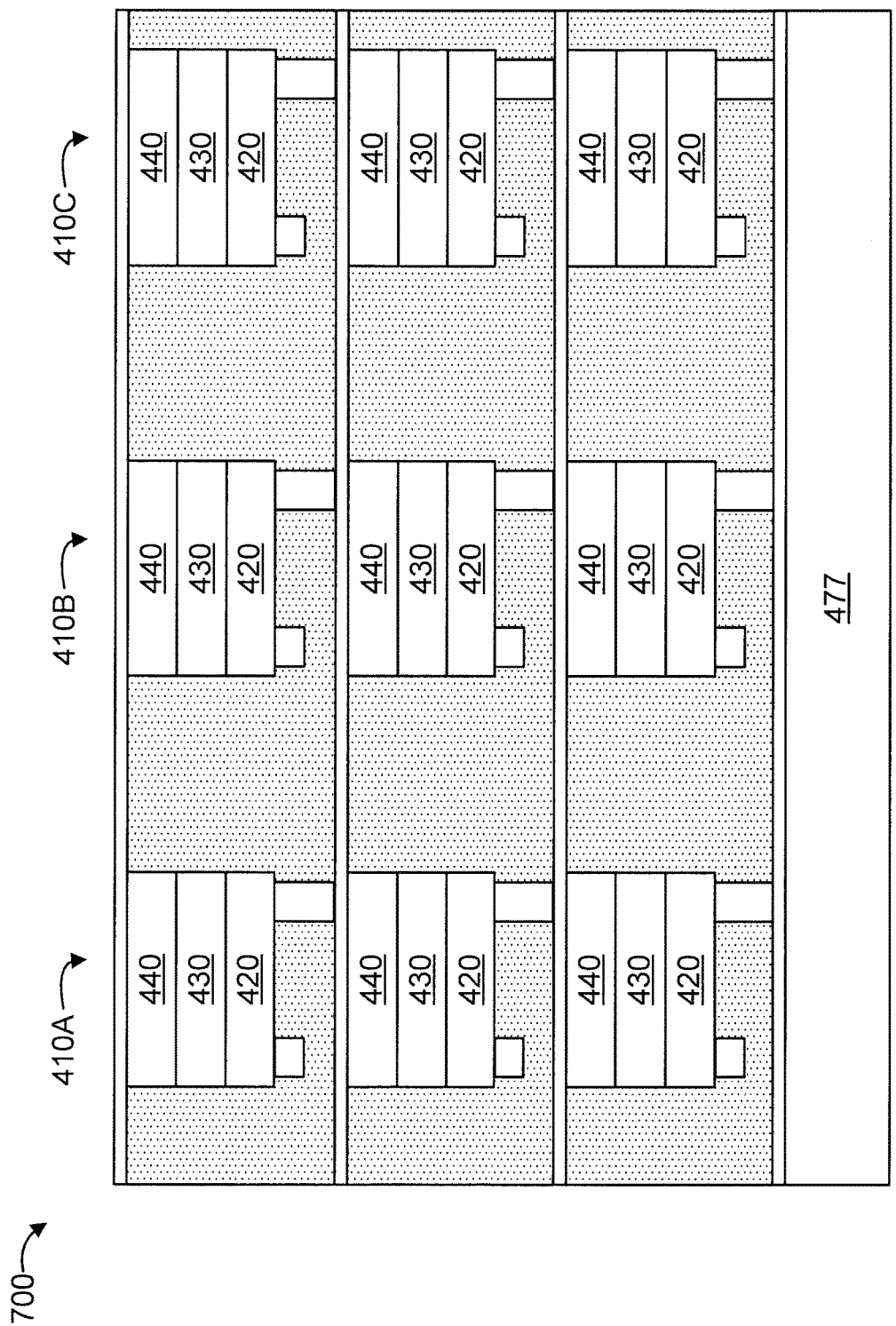
FIG. 7 shows an angled side view of an exemplary 3D stacked resistive memory array, in accordance with an embodiment of the, present invention.

FIG. 6 shows an angled side view of an exemplary 3D stacked resistive memory array 600, in accordance with an embodiment of the present invention. FIG. 7 shows a side view of the exemplary 3D stacked resistive memory array 600 of FIG. 6, in accordance with an embodiment of the present invention. It is to be noted that FIG. 21 can also be considered to show a top view of the exemplary 3D stacked resistive memory array 600 of FIG. 6, in accordance with an embodiment of the present invention.

The 3D stacked resistive memory array 700 includes a set of layer 610 (i.e., layers 610A-610C). Each of the layers 610A-610C includes a set of three-terminal non-volatile memories. Each of the layers 610A-610C can correspond to layer 491 of FIG. 4. Each of the memories in each of the layers 610A-610C can correspond to the three-terminal non-volatile memory 100 of FIG. 1 or the three-terminal non-volatile memory 200 of FIG. 2 or the three-terminal non-volatile memory 300 of FIG. 3.

Figure 8:
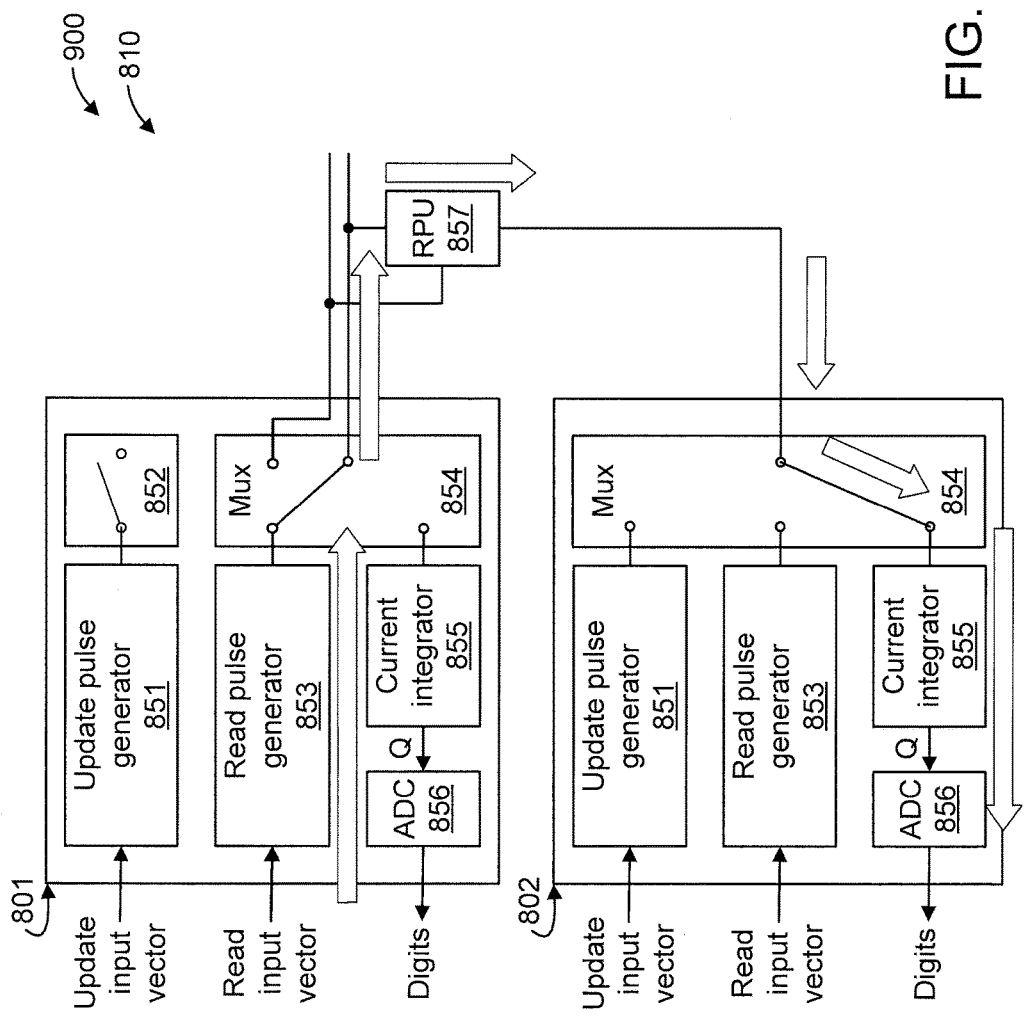
FIG. 8 shows a side view of the exemplary 3D stacked resistive memory array of FIG. 7, in accordance with an embodiment of the present invention.
Figure 9:
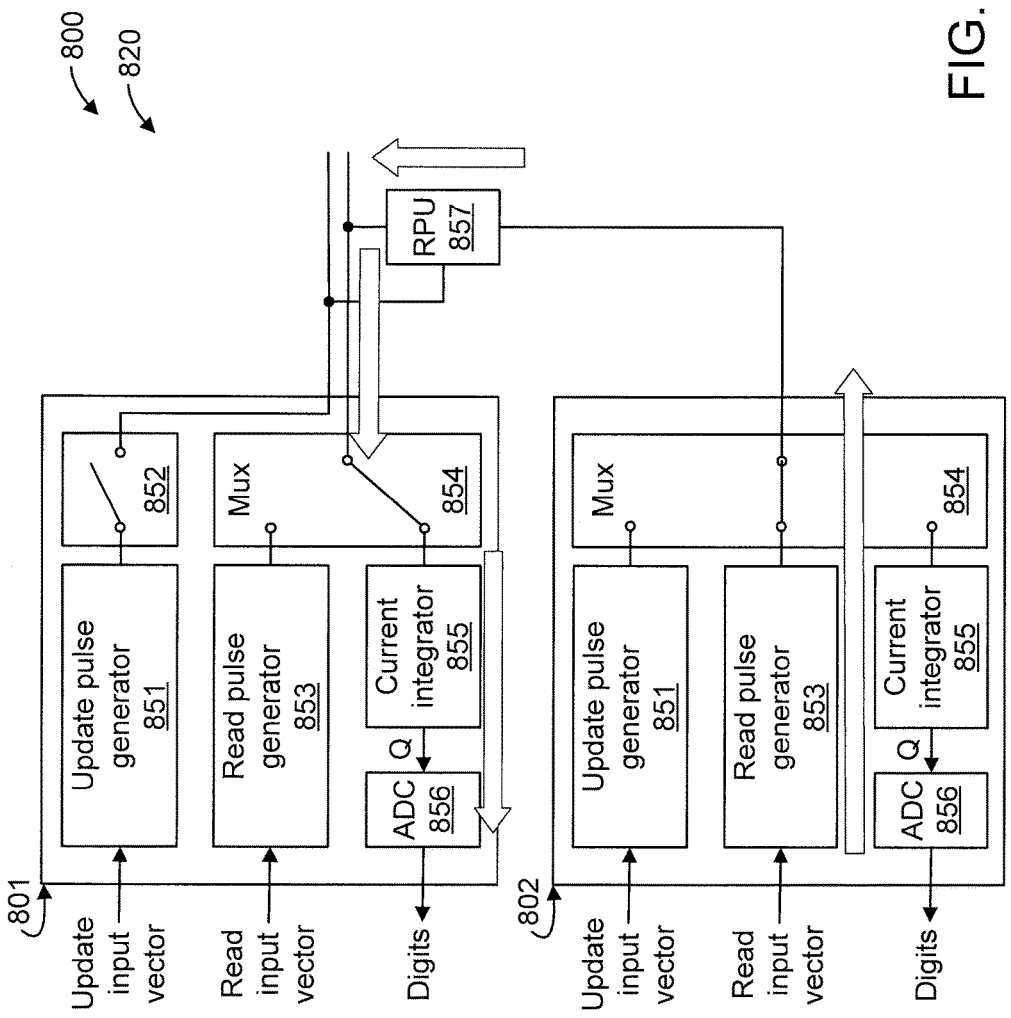
FIGS. 9-11 show an exemplary error back-propagation with a three-terminal device, in accordance with an embodiment of the present invention.
Figure 10:
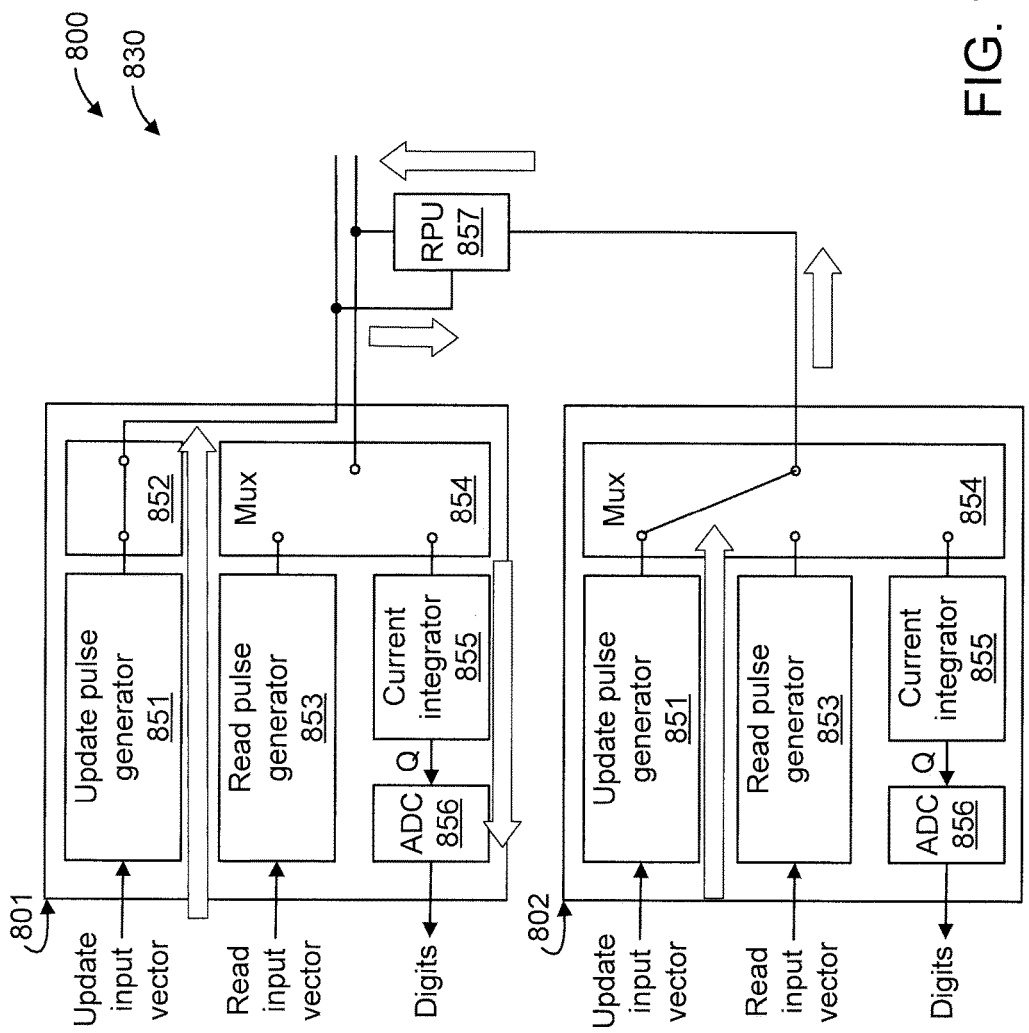

FIGS. 8-10 show an exemplary error back-propagation 800 with a three-terminal device, in accordance with an embodiment of the present invention.

The error back-propagation 800 involves 3 passes, namely a forward pass 810 (see FIG. 8), a backward pass 80 (see FIG. 9), and an update pass (hereinafter "update" in short) 830 (see FIG. 10).

Each of the passes involves a first unit 801, a second unit 802, and a resistive processing unit (RPU) 803.

Each of the units 801 and 802 include: an update pulse generator 851; a read pulse generator 853; a multiplexer ("mux") 854; a current integrator 855; and an analog to digital converter (ADC) 856. Moreover, each of the units 801 includes a switch 852.

A general description will now be given of the preceding elements (801, 802, and 803), followed by respective descriptions of these elements relating to each of the three passes. The update pulse generator 851 receives an update input vector and provides an output to the switch 852. The read pulse generator 852 receives a read input vector and provides an output to the mux 854. The current integrator 855 receives an input from the mux 854 and provides an output (Q) to the ADC 856. The ADC 856 outputs digits. The RPU 857 includes a gate, a drain, and a source.

The following signals correspond to the RPU 857, as shown in TABLE 1.

TABLE 1

| | Gate | Drain | Source |
|---|---|---|---|
| Read | Float | $V_{read}$(GND) | GND($V_{read}$) |
| Update (voltage pulse mode) | $V_{prog,increase}$($V_{prog,decrease}$) | Float | GND |
| Update (current pulse mode) | $+I_{prog}$($-I_{prog}$) | Float | GND |

In the forward pass 810, the read input vector is received by the read pulse generator 853 (of the first unit 801), which provides a corresponding output to the mux 854 (of the first unit 801) that is then provided to the source of the RPU 803, the drain of the RPU 803, and the current integrator 855 (of the second unit 802). An output of the current integrator 855 (of the second unit 802) is provided to an input of the ADC 856 (of the second unit 802). The ADC 856 (of the second unit 802) outputs digits.

In the backward pass 820, the read input vector is received by the read pulse generator 853 (of the second unit 802), which provides a corresponding output to the mux 854 (of the second unit 802) that is then provided to the drain of the RPU 803, the source of the RPU 803, and the current integrator 855 (of the first unit 801). An output of the current integrator 855 (of the first unit 801) is provided to an input of the ADC 856 (of the first unit 801). The ADC 856 (of the first unit 801) outputs digits.

In the update pass 830 the update input vector is received by the update pulse generator 851 (of the first unit 801), which provides a corresponding output to the mux 854 (of the first unit 801) that is then provided to the gate of the RPU 803. Moreover, the update input vector is received by the update pulse generator 851 (of the second unit 802), which provides a corresponding output to the mux 854 (of the second unit 802) that is then provided to the drain of the RPU 803.

Figure 11:
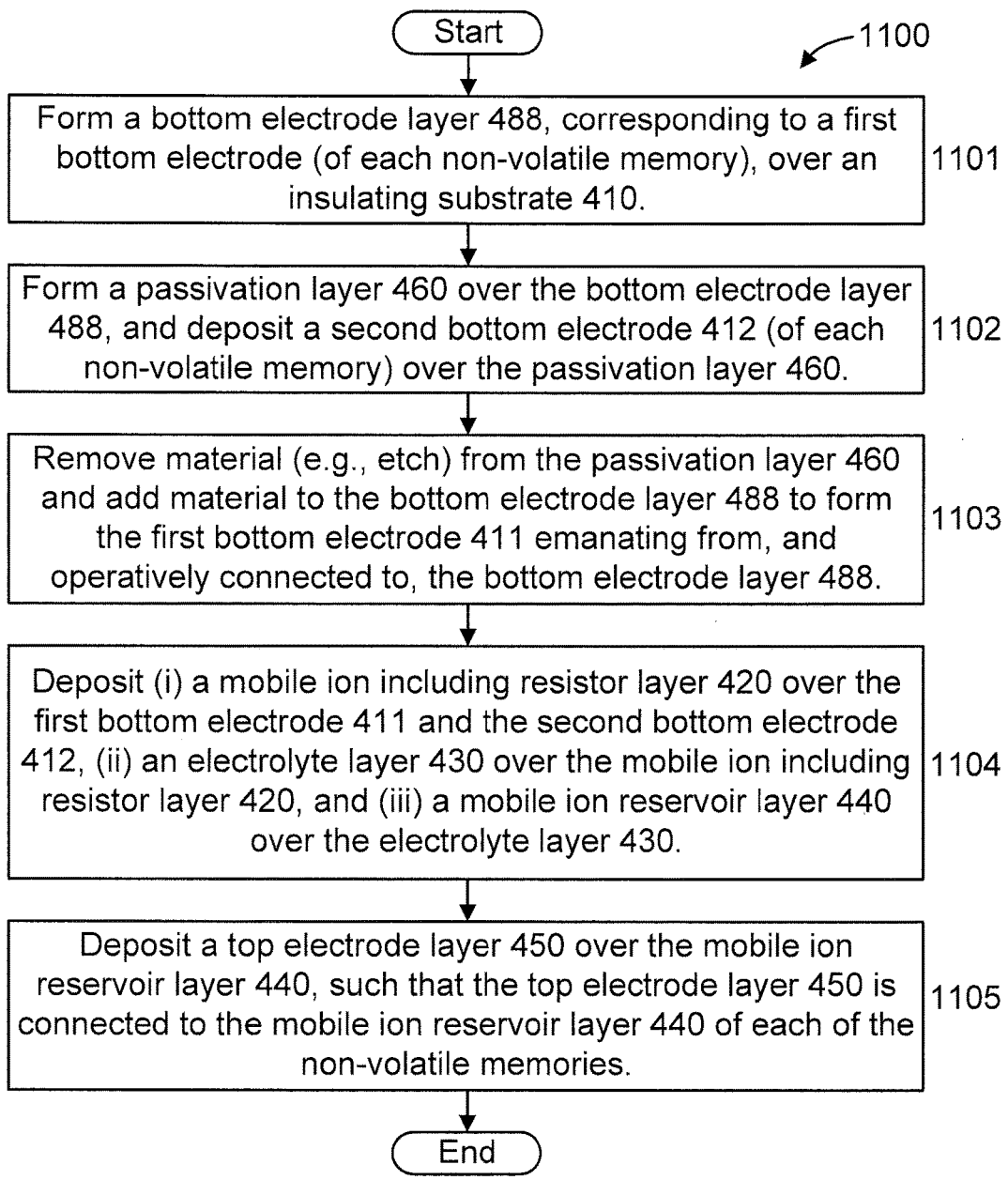

FIGS. 11-21 show an exemplary method 1100 for forming a three-terminal non-volatile multi-state memory, in accordance with an embodiment of the present invention. It is to be appreciated that one or more steps of method 1100 can be performed using a vacuum deposition process. FIG. 11 textually represents method 1100, while FIGS. 12-16 graphically represent method 1100 with respect to a side view, and FIGS. 17-21 graphically represent method 1100 with respect to a top view.

Figure 12:
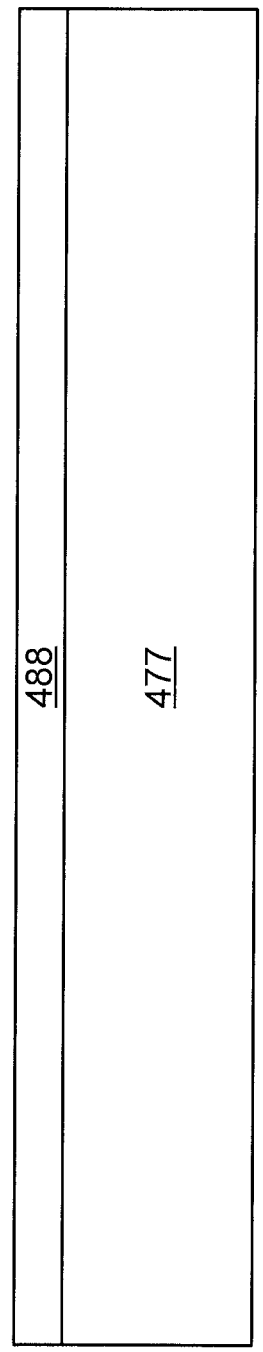
FIGS. 12-21 show an exemplary method for forming a three-terminal non-volatile multi-state memory, in accordance with an embodiment of the present invention.
Figure 17:
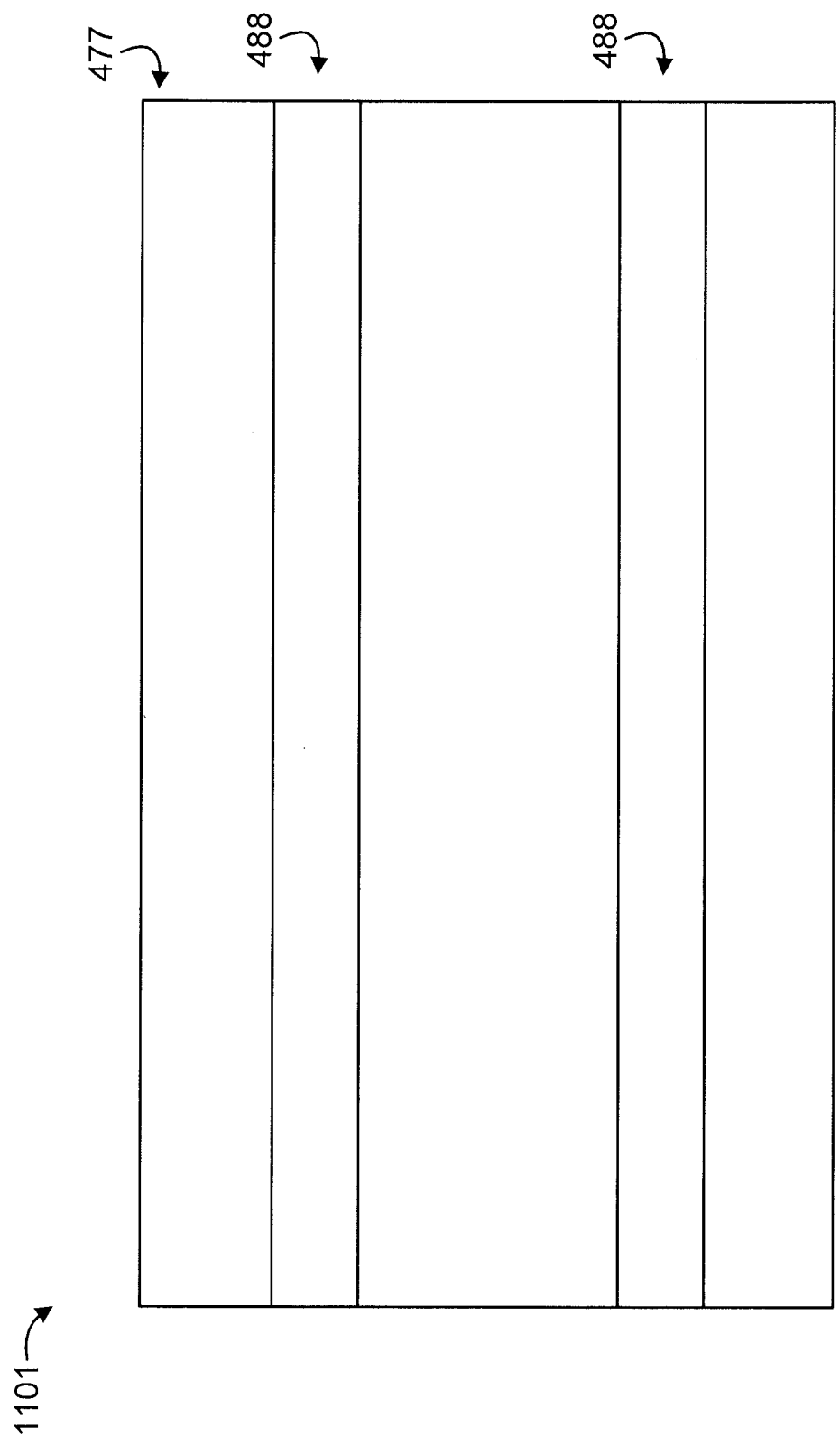

Referring to FIGS. 11, 12, and 17, at step 1101, form a bottom electrode layer 488, corresponding to a first bottom electrode (of each non-volatile memory), over an insulating substrate 410.

Figure 13:
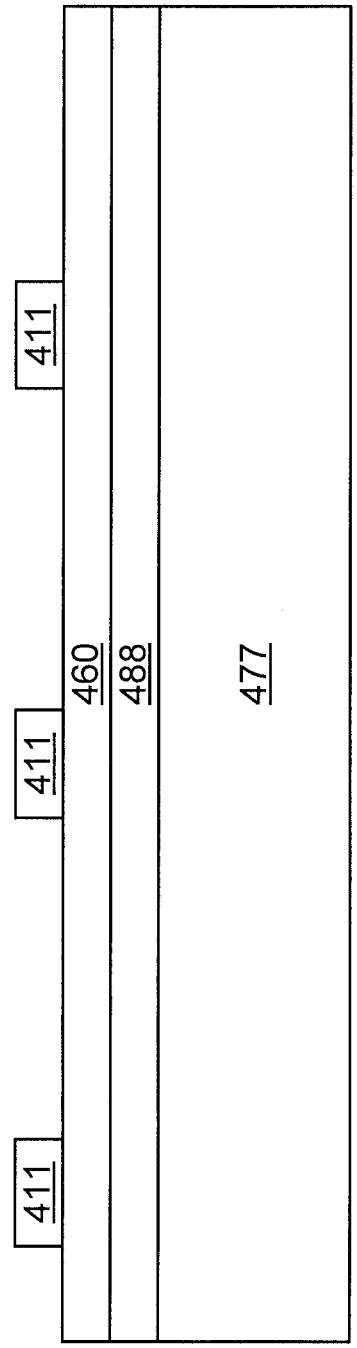
Figure 18:
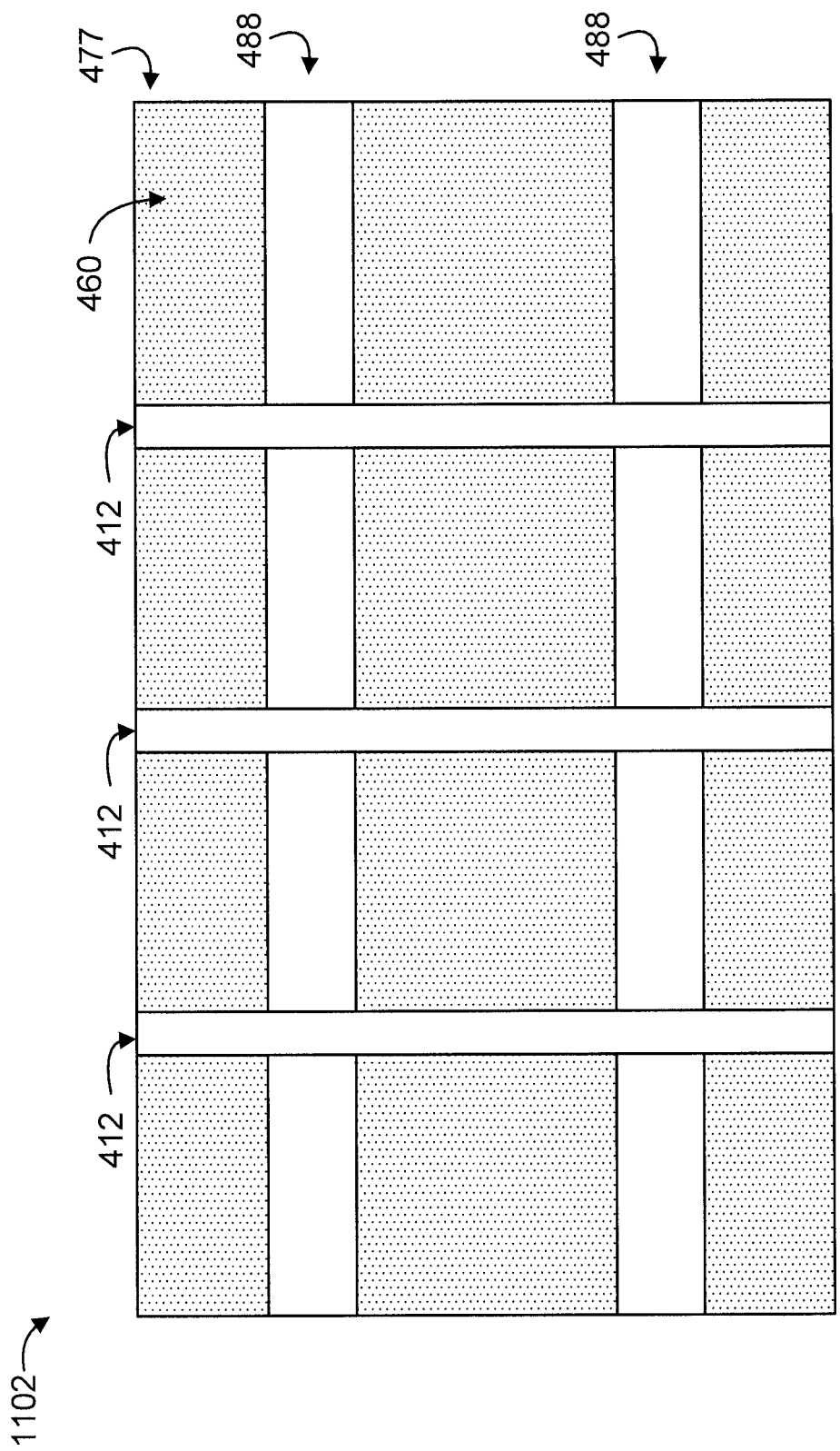

Referring to FIGS. 11, 13, and 18, at step 1102, form a passivation layer 460 over the bottom electrode layer 488, and deposit a second bottom electrode 412 (of each non-volatile memory) over the passivation layer 460.

Figure 14:
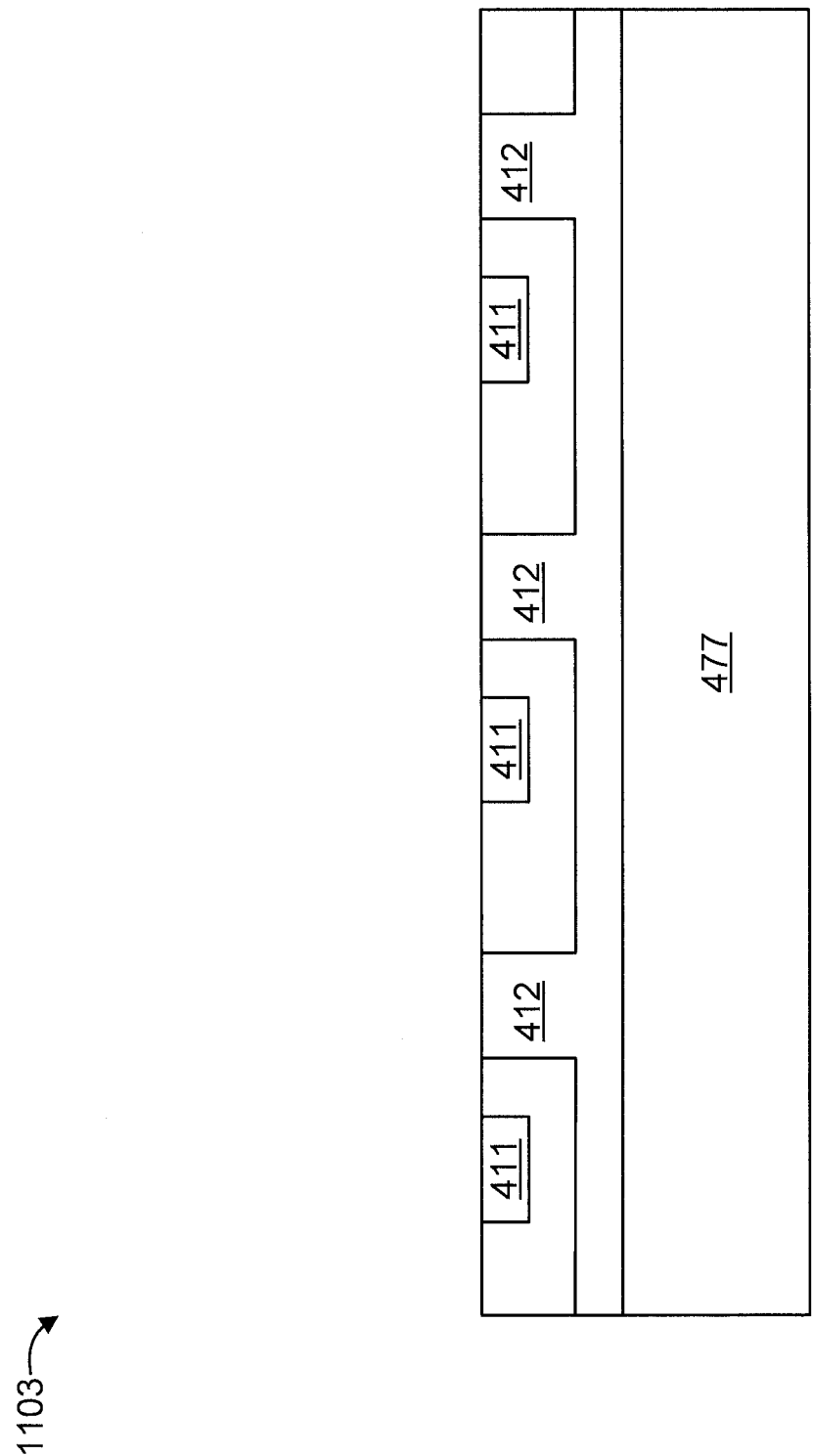
Figure 19:
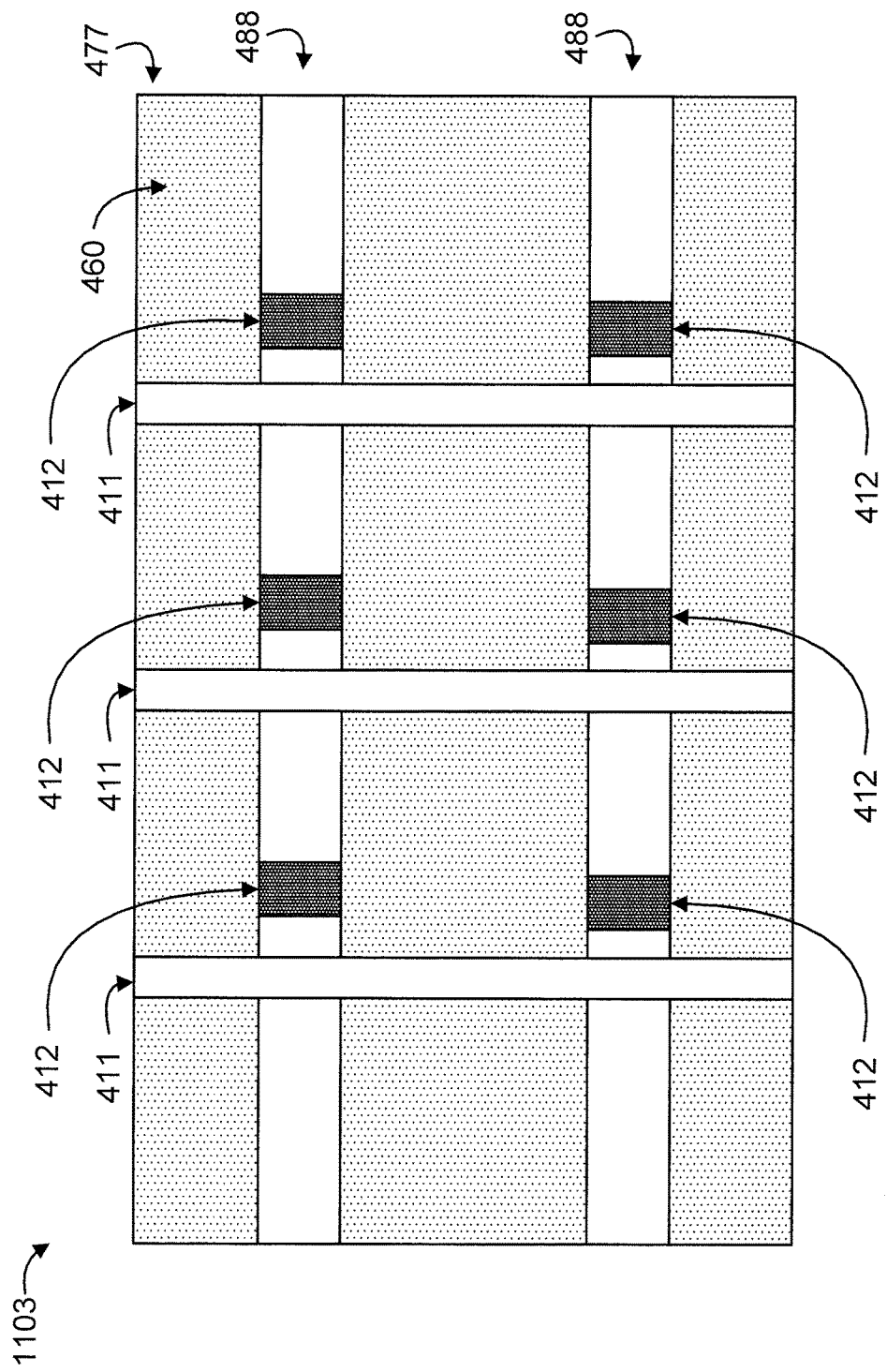

Referring to FIGS. 11, 14, and 19, at step 1103, remove material (e.g., etch) from the passivation layer 460 and add material to the bottom electrode layer 488 to form the first bottom electrode 411 emanating from, and operatively connected to, the bottom electrode layer 488.

Figure 15:
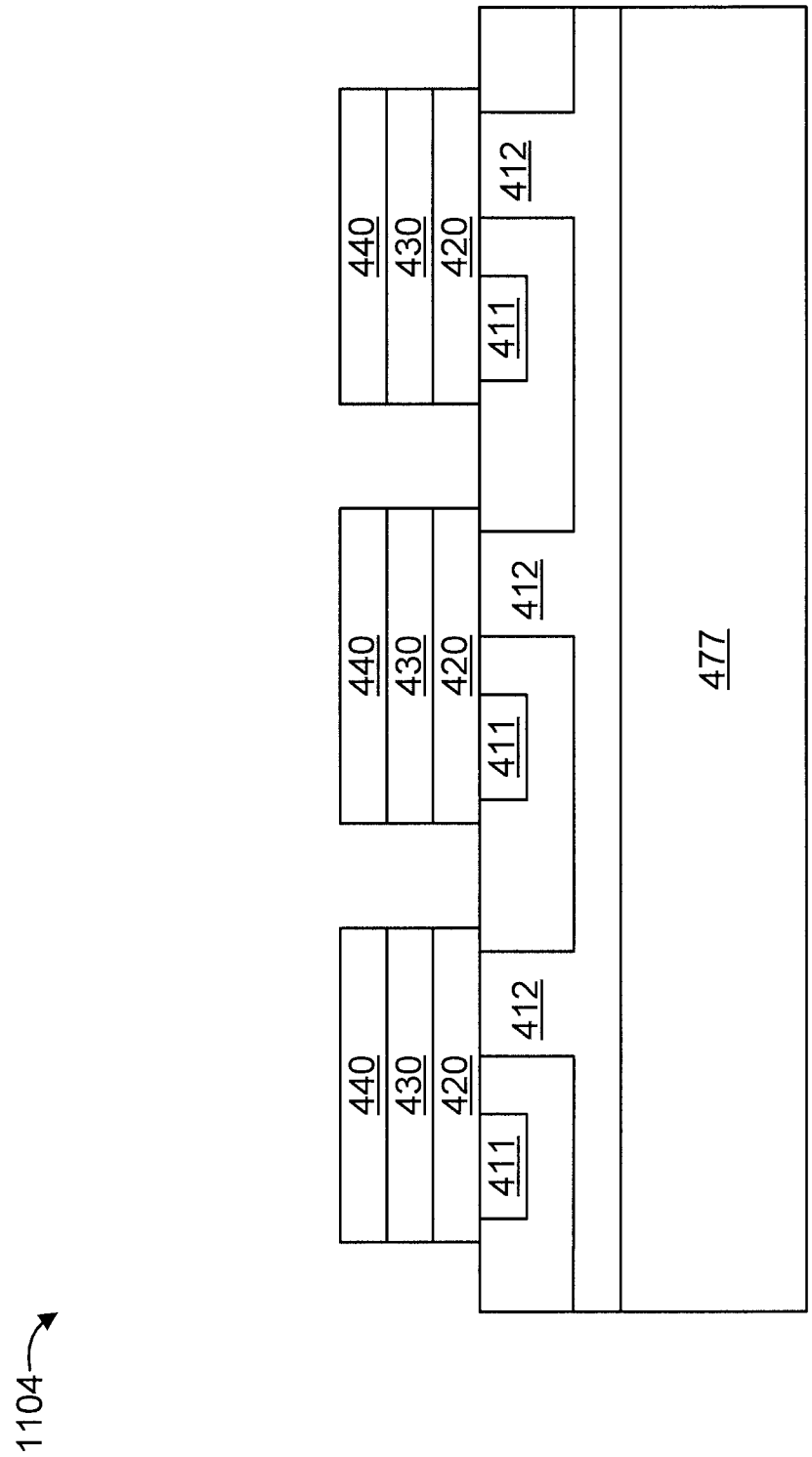
Figure 20:
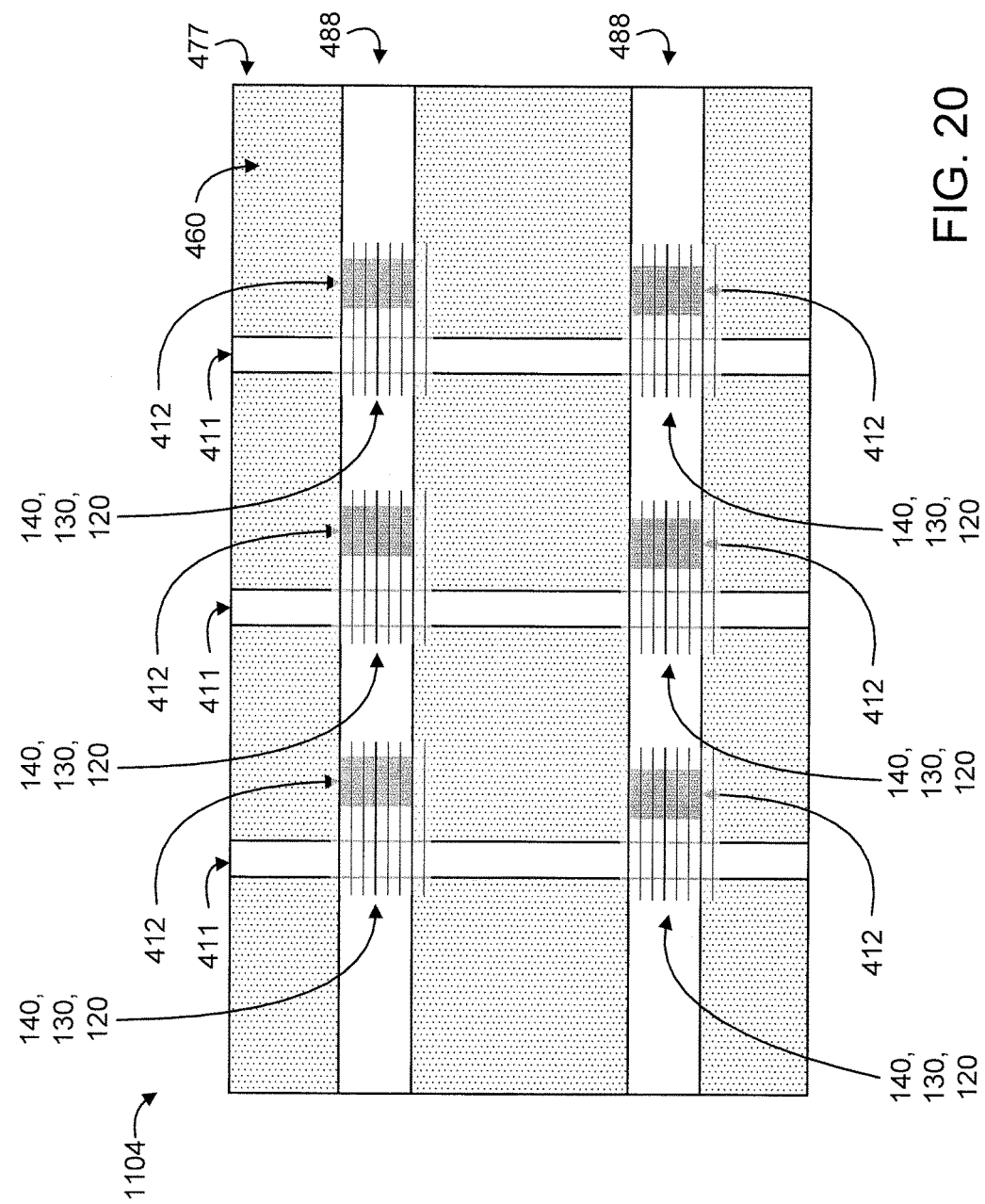

Referring to FIGS. 11, 15, and 20, at step 1104, deposit (i) a mobile ion including resistor layer 420 over the first bottom electrode 411 and the second bottom electrode 412, (ii) an electrolyte layer 430 over the mobile ion including resistor layer 420, and (iii) a mobile ion reservoir layer 440 over the electrolyte layer 430.

Figure 16:
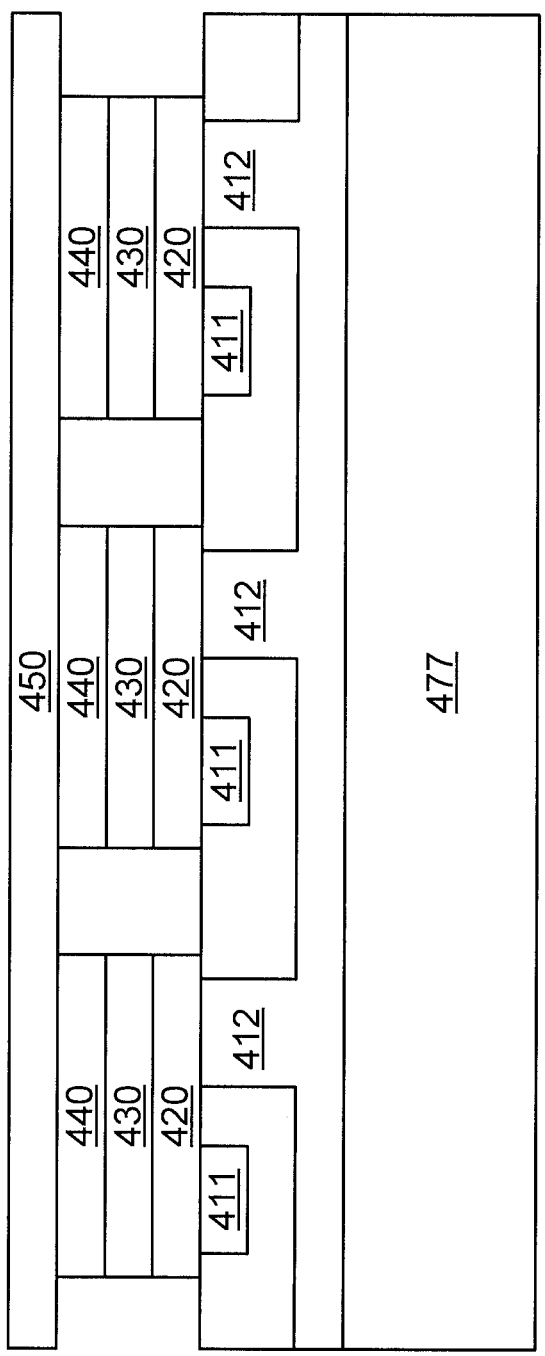
Figure 21:
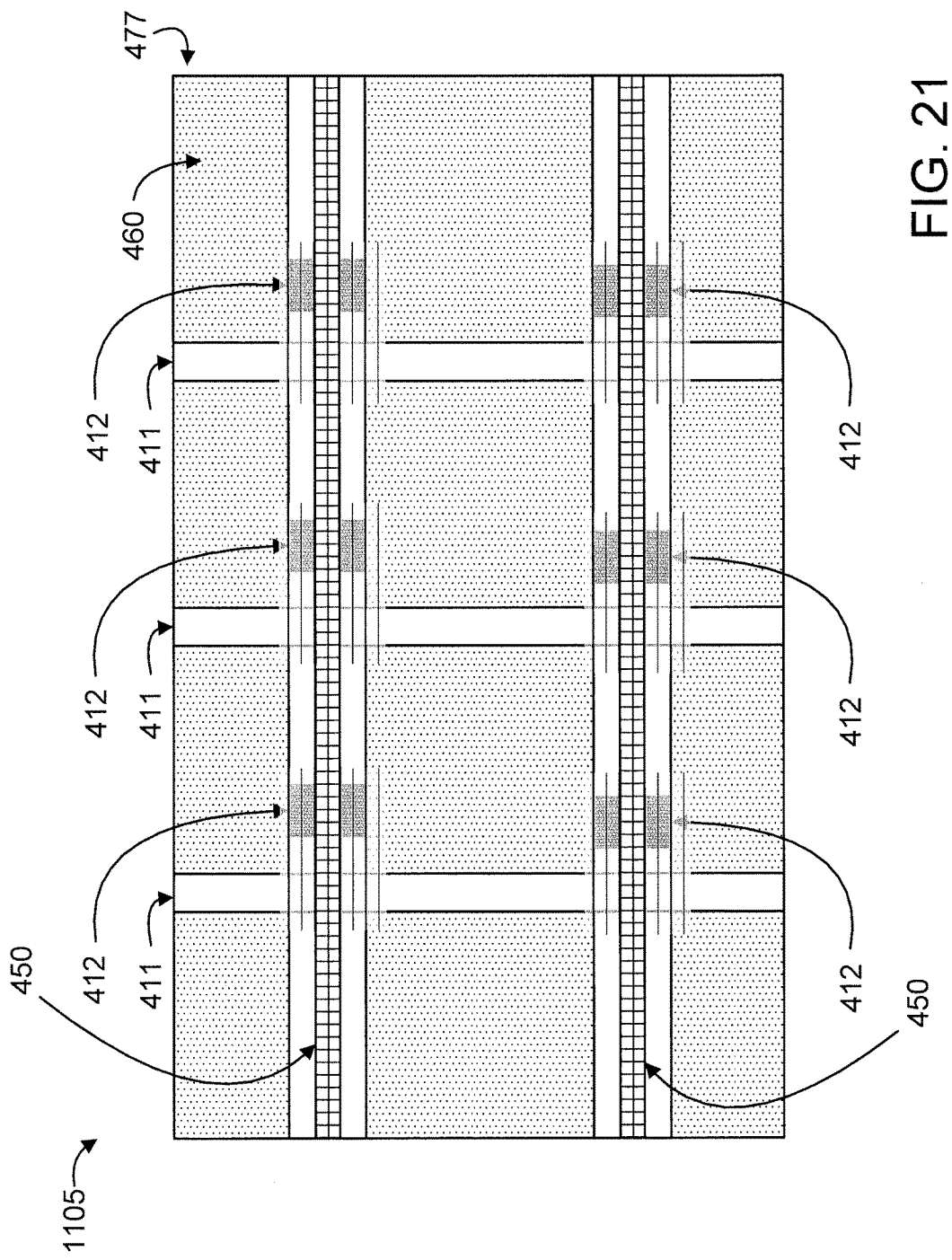

Referring to FIGS. 11, 16, and 21, at step 1105, deposit a top electrode layer 450 over the mobile ion reservoir layer 440, such that the top electrode layer 450 is connected to the mobile ion reservoir layer 440 of each of the non-volatile memories.

A description will now be given regarding some of the many attendant advantages/features of the present invention.

The present invention advantageously provides a novel device structure and materials for a non-volatile memory device that can be used, for example, in a cognitive and/or neuromorphic computing application/device.

The present invention provides mobile ion (lithium)-based compounds with metal-insulator transition by the mobile ion (lithium) contents.

The present invention provides resistance control by mobile ion (lithium) migration.

The present invention provides an all solid state device that is compatible with vacuum deposition processes.

The present invention can be implemented in a memristive-based machine learning device for an efficient alterative to Von-Neuman computing architectures.

These and other advantages/features of the present invention are readily determined by one of ordinary skill in the art given the teachings of the present invention provided herein, while maintaining the spirit of the present invention.

It is to be, understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the. other element or intervening elements can also present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the, chip design in question that are to be formed on a wafer. The photolithographic masks are utilized to define areas of the wafer (and/or the layers thereon) to be etched or otherwise processed.

Methods as described herein can be used in the lubrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will he referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or " and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A three-terminal non-volatile multi-state memory device based on mobile ion induced electrical resistivity change, comprising:
   a substrate having a first electrode and a second electrode therein;
   a mobile ion including resistor layer disposed over the first electrode, the second electrode, and part of the substrate;
   a third electrode formed over the mobile ion including resistor layer;
   an electrolyte layer formed over the mobile ion including resistor layer and under the third electrode; and
   a mobile ion reservoir layer formed over the electrolyte layer and under the third electrode,
   wherein the electrolyte layer is formed from lithium phosphorus oxynitride.

2. The three-terminal non-volatile multi-state memory device of claim 1, wherein the mobile ion reservoir layer is formed from a mobile ion bearing material.

3. The three-terminal non-volatile multi-state memory device of claim 1, wherein the first electrode and the second electrode form bottom electrodes, and the three-terminal non-volatile memory device further comprises an electrically conductive mobile ion barrier layer disposed between the mobile ion including resistor layer and the bottom electrodes.

4. The three-terminal non-volatile multi-state memory device of claim 1, wherein the mobile ion including resistor layer is doped to reduce a volume change during an ion migration process selected from the group consisting of a lithiation process and a de-lithiation process.

5. The three-terminal non-volatile multi-state memory device of claim 4, wherein the mobile ion including resistor layer is formed from Mn doped $LiCoO_2$.

6. The three-terminal non-volatile multi-state memory device of claim 1, wherein the part of the substrate, over which the mobile ion including resistor layer is disposed, comprises a space in the substrate between the first electrode and the second electrode.

7. The three-terminal non-volatile multi-state memory device of claim 1, wherein the mobile ion including resistor layer comprises a plurality of crystals that are thermally treated to improve a crystal structure and a crystal orientation of the plurality of crystals.

8. The three-terminal non-volatile multi-state memory device of claim 1, wherein the first electrode is configured to selectively initiate a read process and a write process for a memory cell, and the three-terminal non-volatile memory device further comprises one or more hardware-based switching elements for disconnecting the first electrode during times other than during the read process and the write process to prevent a state change of the memory cell.

9. The three-terminal non-volatile multi-state memory device of claim 1, wherein the mobile ion including resistor layer is formed from a mobile ion bearing material whose electrical resistivity changes based on a mobile ion concentration in the material.

10. The three-terminal non-volatile multi-state memory device of claim 1, wherein the substrate is formed from one or more materials resistant to mobile ion diffusion.

11. The three-terminal non-volatile multi-state memory device of claim 1, wherein the part of the substrate is in direct contact with a portion of the mobile ion including resistor layer.

12. A non-volatile memory array based on mobile ion induced electrical resistivity change, comprising:
   a plurality of three-terminal non-volatile multi-state memory devices, each comprising:
      a substrate having a first electrode and a second electrode therein;
      a mobile ion including resistor layer disposed over the first electrode, the second electrode, and part of the substrate;
      a third electrode formed over the mobile ion including resistor layer;
      an electrolyte layer formed over the mobile ion including resistor layer and under the third electrode; and
      a mobile ion reservoir layer formed over the electrolyte layer and under the third electrode,
      wherein the electrolyte layer is formed from lithium phosphorus oxynitride.

13. The non-volatile memory array of claim 12, wherein the plurality of three-terminal non-volatile multi-state memory devices are formed on a common plane.

14. The non-volatile memory array of claim 13, wherein the plurality of three-terminal non-volatile multi-state memory devices are formed in two or more rows on the common plane.

15. The non-volatile memory array of claim 12, wherein the plurality of three-terminal non-volatile multi-state memory devices comprise two or more sets of non-volatile multi-state memory devices, wherein each of the two or more sets is arranged on a respective one of at least two stratums of a three-dimensional stacked integrated circuit structure.

16. The non-volatile memory array of claim 12, wherein each of the three-terminal non-volatile multi-state memory devices is configured to be read responsive to an application of a stimulus applied to the first electrode and the second electrode and is further configured to be written responsive to the application of the stimulus applied to the first electrode and the third electrode.

17. The non-volatile memory array of claim 12, wherein the mobile ion including resistor layer is formed from a mobile ion bearing material whose electrical resistivity changes based on a mobile ion concentration in the material.

18. A method for forming a three-terminal non-volatile multi-state memory device based on mobile ion induced electrical resistivity change, comprising:
   forming a substrate having a first electrode and a second electrode therein;
   forming a mobile ion including resistor layer disposed over the first electrode, the second electrode, and part of the substrate;
   forming a third electrode over the mobile ion including resistor layer;
   forming an electrolyte layer over the mobile ion including resistor layer and under the third electrode; and
   forming a mobile ion reservoir layer over the electrolyte layer and under the third electrode,
   wherein the electrolyte layer is formed from lithium phosphorus oxynitride.

* * * * *